United States Patent [19]
Arita

[11] 3,865,651

[45] Feb. 11, 1975

[54] METHOD OF MANUFACTURING SERIES GATE TYPE MATRIX CIRCUITS

[75] Inventor: Shigeru Arita, Ibaragi, Japan

[73] Assignee: Matsushita Electronics Corporation, Osaka, Japan

[22] Filed: Mar. 12, 1973

[21] Appl. No.: 340,255

[30] Foreign Application Priority Data

Mar. 14, 1972 Japan .............................. 47-26256

[52] U.S. Cl...................... 148/187, 29/571, 29/577, 29/578, 357/23, 357/41, 357/45, 357/86

[51] Int. Cl....... H01l 7/44, H01l 27/10, B01j 17/00

[58] Field of Search ............ 148/187; 317/235, 239, 317/22, 22.2; 29/571, 577, 578

[56] References Cited

UNITED STATES PATENTS

| | | | |
|---|---|---|---|
| 3,443,176 | 5/1969 | Agusta et al. | 317/235 |
| 3,519,504 | 7/1970 | Cuomo | 148/187 |
| 3,608,189 | 9/1971 | Gray | 29/571 |
| 3,649,885 | 3/1972 | Nienhuis | 317/235 |
| 3,696,276 | 10/1972 | Boland | 317/235 |
| 3,698,077 | 10/1972 | Dahlberg | 29/578 |
| 3,739,238 | 6/1973 | Hara | 317/235 |
| 3,747,200 | 7/1973 | Rutledge | 29/571 |

*Primary Examiner*—C. Lovell

*Assistant Examiner*—W. G. Saba

*Attorney, Agent, or Firm*—Stevens, Davis, Miller & Mosher

[57] ABSTRACT

An improved method of manufacturing series gate type matrix circuits by a self-alignment technique is provided. In this method, the drain and the source of a selected MOS field-effect transistor are short-circuited by a diffused region of a semiconductivity type opposite to that of a silicon substrate and formed prior to the formation of a gate portion. This method eliminates the use of interconnecting conductors for short-circuiting the drains and the sources with the result that the surface area of the substrate which might have been occupied by such interconnecting conductors may be dispensed with to facilitate integration and moreover any desired matrix circuit may be formed by controlling conduction of such diffused regions.

3 Claims, 7 Drawing Figures

METHOD OF MANUFACTURING SERIES GATE TYPE MATRIX CIRCUITS

The present invention relates to a method of manufacturing series gate type matrix circuits in large scale integrated circuits by a self-alignment technique.

Figure 1:
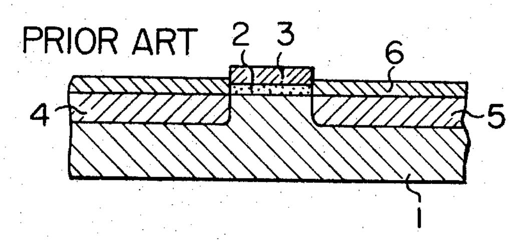
Figure 2A:
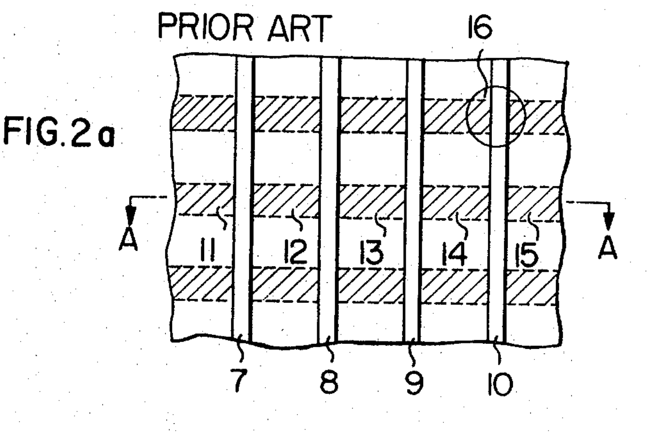
Figure 2B:
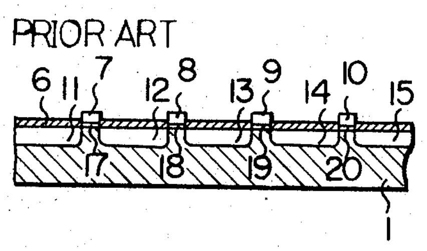
Figure 2C:
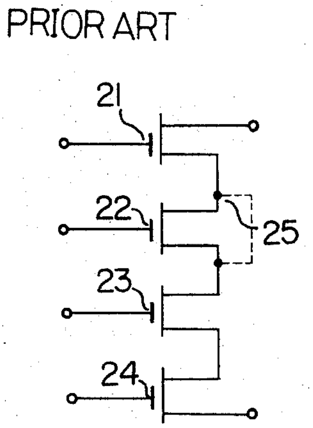
PRIOR ART FIG.2c
Figure 3:
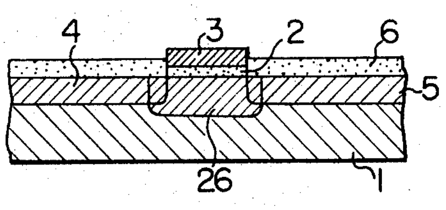
Figure 4A:
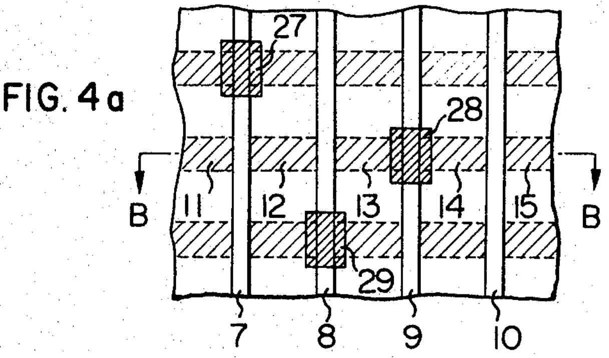
Figure 4B:
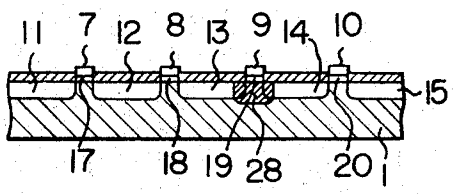

In the accompanying drawings;

FIG. 1 is a sectional view of the MOS field-effect transistor in a conventional large scale integrated circuit fabricated by the self-alignment technique;

FIGS. 2*a* and 2*b* illustrate respectively a plan view and sectional view of an enlarged portion of a large scale integrated circuit fabricated by a conventional method;

FIGS. 2*c* is a schematic diagram showing the circuit construction of FIG. 2*b*;

FIG. 3 illustrates the interconnection of the two regions of a MOS field effect transistor according to the method of the present invention; and FIGS. 4*a* and 4*b* illustrate a plan view and sectional view for explaining the method of the invention for manufacturing series gate matrix large scale integrated circuits and the elements formed by the method.

The unit structure of a MOS field-effect transistor in a prior art large scale integrated circuit comprises, as shown in FIG. 1 of the accompanying drawing, a gate oxide layer 2 formed on a silicon substrate 1 having one type of conductivity, a gate electrode layer 3 placed on the gate oxide layer 2, and a drain region 4 and a source region 5 having another type of conductivity opposite to that of the silicon substrate and formed on both sides of the gate section. Numeral 6 designates a silicon dioxide layer formed during the diffusion process for forming the drain and source regions.

With the self-alignment technique, it has been the practice to use a polycrystalline silicon or molybdenum for gate electrodes, since a material with a low melting point, e.g., aluminum cannot be used for gate electrodes.

In this case, the gate electrode serves as a mask against impurities during the formation of a drain or source region by the diffusion process and it is this masking effect that enables the formation of the drain and source regions shown in FIG. 1.

FIGS. 2*a* and 2*b* illustrate an enlarged portion of a conventional type of large scale integration circuit manufactured by the self-alignment technique as above described, and FIG. 2*a* is a plan view of this portion, FIG. 2*b* is a section taken along the line A—A of FIG. 2*a* and FIG. 2*c* shows the circuit construction of FIG. 2*a*.

In FIG. 2*a*, numerals 7, 8, 9 and 10 designate gate electrode layers of molybdenum, for example, which are used as masks for forming a plurality of diffused regions 11 through 15 having a type of conductivity opposite to that of a silicon substrate. And, as shown at 16 in FIG. 2*a*, a MOS field-effect transistor is formed at each of the gate electrode layer portions where the diffused regions are formed on both sides thereof.

To more clearly show the structure of the MOS field-effect transistor which has thus been fabricated, FIG. 2*b* illustrates a sectional view taken along the line A—A of FIG. 2*a* and, as will be seen from the figure, the individual diffused region provides a drain region and source region for different field-effect transistors. In FIG. 2*b*, numeral 6 designates a silicon dioxide layer formed during the formation of the diffused regions.

The formation of diffused regions in this manner results in the fabrication at the portions shown in FIG. 2*b* of MOS field-effect transistors 21 through 24 whose drain and source electrodes are interconnected as shown in FIG. 2*c*.

With the MOS field-effect transistors fabricated in this manner, as shown in FIG. 2*c*, their drain-source circuits are necessarily connected in cascade and therefore it is impossible in this configuration to manufacture a desired matrix circuit.

For instance, if it is desired to short-circuit the drain and the source of the MOS field-effect transistor 22 as shown in FIG. 2*c* by a dotted line 25 to disable the MOS field-effect transistor 22 to perform its function, a strip of metal layer whose one end is in ohmic contact with the source region and the other end is in ohmic contact with the drain region must be placed on the silicon substrate in an intersecting relation with the gate electrode.

In other words, the provision of such connecting means to manufacture a desired matrix circuit necessarily occupies a portion of the surface area of the silicon substrate and this gives rise to an inconvenience that the provision of such connecting means prevents the improvement in the degree of integration of large scale integration circuits.

It is therefore an object of the present invention to provide an improved method of manufacturing series gate type matrix circuits by fully utilizing the self-alignment technique, which eliminates the drawbacks of the prior art methods and in which the required connection between the two regions of the respective MOS field-effect transistors constituting a matrix circuit is provided by a diffused region formed on the silicon substrate prior to the formation of the gate electrode sections.

A unique feature of the improved manufacturing method according to the present invention is that since the connection between the two regions of the respective MOS field-effect transistors are all formed within the silicon substrate, the inherent drawback of the prior art methods wherein the interconnecting means are placed on the silicon substrate preventing the improvement in the degree of integration, may be eliminated.

The method of manufacturing series gate type matrix circuits according to the present invention will now be explained with reference to FIGS. 3, 4*a* and 4*b*.

FIG. 3 illustrates the interconnection of the two regions of a MOS field-effect transistor which constitutes a novel feature of the present invention. As shown in FIG. 3, a drain region 4 and a source region 5 of a MOS field-effect transistor are interconnected by a diffused region 26 formed directly below the gate electrode section. This diffused region 26 is selectively diffused into the silicon substrate prior to the formation of a gate oxide layer 2 and a gate electrode layer 3 as previously mentioned. During the etching process for leaving the gate electrode layer on the silicon substrate, care is taken to leave the gate electrode layer on the diffused region 26 so that when the subsequent diffusion process for forming the drain and source regions 4 and 5 is completed, the drain and source regions 4 and 5 thus diffused into the silicon substrate may be interconnected and short-circuited by way of the diffused region 26.

FIG. 4*a* is an explanatory view of the method for fabricating series gate type matrix circuits which makes a full use of the interconnection technique described above. In this method, preliminary diffused regions for fabricating a matrix circuit are formed, for example, at the positions designated as 27, 28 and 29. Following the formation of these diffused regions, a diffusion process for forming drain and source regions as well as gate electrode layers is effected in the like manner as the conventional diffusion processes. When these processes have been completed, a MOS field-effect transistor is formed by each of the gate electrode layers and the diffused regions formed on both sides of the gate electrode layer. However, at the positions 27, 28 and 29 where the preliminary diffused regions have been previously formed, the diffused regions formed on both sides of the gate electrode layer are interconnected by way of the preliminary diffused region and thus no MOS field-effect transistor is fabricated at these positions.

FIG. 4*b* is a section taken along the line B—B of FIG. 4*a* to show this condition more clearly. As will be seen from the figure, diffused regions 13 and 14 formed under a gate electrode 9 are interconnected through the preliminary diffused region 28 and thus there is no MOS field-effect transistor formed at this portion of the substrate. As also shown in FIGS. 3, 4*a* and 4*b*, the width of the gate portion placed on the preliminary diffused region is equal to or smaller than the width of the diffused region.

In other words, by forming as many preliminary diffused regions as required at preselected positions on a silicon substrate in consideration of a matrix circuit to be fabricated, any desired series gate matrix circuit may be fabricated by utilizing the self-alignment technique.

What we claim is:

1. A method of manufacturing a series gate type matrix circuit comprising the steps of: forming at least one preliminary diffused region in a silicon substrate of one semiconductivity type, said preliminary diffused region being of the other semiconductivity type opposite to that of said silicon substrate; forming a gate oxide layer and a gate electrode layer on said silicon substrate and etching to leave a plurality of strip gate portions, at least one of said strip gate portions having a portion thereof placed on said preliminary diffused region in such a way that the width of said gate portion is equal to or smaller than the width of said diffused region; and forming on both sides of each of said strip gate portions a plurality of diffused regions which act as a drain and source region of a MOS transistor whereby the drain and source regions of selected ones of the MOS field-effect transistors are short-circuited by said preliminary diffused region to thereby form a matrix circuit.

2. A method according to claim 1, wherein said gate electrode layer is made of molybdenum.

3. A method according to claim 1, wherein said gate electrode layer is made of poly-silicon or polycrystalline silicon.

* * * * *